United States Patent
Lee et al.

(10) Patent No.: US 10,319,643 B1
(45) Date of Patent: Jun. 11, 2019

(54) VERTICAL FET WITH STRAINED CHANNEL

(71) Applicant: International Business Machines Corporation, Armonk, NY (US)

(72) Inventors: Choonghyun Lee, Rensselaer, NY (US); Kangguo Cheng, Schenectady, NY (US); Juntao Li, Cohoes, NY (US); Shogo Mochizuki, Clifton Park, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/890,699

(22) Filed: Feb. 7, 2018

(51) Int. Cl.
| | |
|---|---|
| H01L 27/092 | (2006.01) |
| H01L 21/8238 | (2006.01) |
| H01L 21/02 | (2006.01) |
| H01L 29/66 | (2006.01) |
| H01L 29/10 | (2006.01) |
| H01L 21/308 | (2006.01) |
| H01L 29/78 | (2006.01) |
| H01L 21/3065 | (2006.01) |

(52) U.S. Cl.
CPC .. *H01L 21/823885* (2013.01); *H01L 21/0245* (2013.01); *H01L 21/02381* (2013.01); *H01L 21/02532* (2013.01); *H01L 21/02592* (2013.01); *H01L 21/308* (2013.01); *H01L 21/3065* (2013.01); *H01L 21/823807* (2013.01); *H01L 27/092* (2013.01); *H01L 29/1037* (2013.01); *H01L 29/6656* (2013.01); *H01L 29/7827* (2013.01); *H01L 29/7849* (2013.01)

(58) Field of Classification Search
CPC .......... H01L 27/0886; H01L 21/02381; H01L 21/02532; H01L 21/30604; H01L 21/823431; H01L 21/823885; H01L 21/823437; H01L 29/16; H01L 29/7849; H01L 29/7842; H01L 29/092; H01L 29/7827
See application file for complete search history.

(56) References Cited

U.S. PATENT DOCUMENTS

| | | | |
|---|---|---|---|
| 9,202,918 B2 | 12/2015 | Xie et al. | |
| 9,368,572 B1 | 6/2016 | Cheng et al. | |
| 9,391,078 B1 * | 7/2016 | Liu | H01L 27/0924 |

(Continued)

*Primary Examiner* — Ahmed N Sefer
(74) *Attorney, Agent, or Firm* — Cantor Colburn LLP; Vazken Alexanian

(57) ABSTRACT

Provided is a method for forming a semiconductor structure. In embodiments of the invention, the method includes depositing a strain relaxed buffer (SRB) layer over a substrate; recessing the SRB layer on a first region of the structure; and forming a first semiconductor layer on the first region of the structure and depositing one or more mandrels over the first semiconductor layer of the first region of the structure. The method further includes depositing a spacer layer over the one or more mandrels, the spacer layer including vertical portions and horizontal portions; and removing the one or more mandrels and the horizontal portions of the spacer layer. The method further includes performing a reactive ion etch to remove material unprotected by the spacer to form a first channel for a p-type vertical field effect transistor from the first semiconductor layer. The first channel has a compressive strain.

19 Claims, 9 Drawing Sheets

(56) References Cited

U.S. PATENT DOCUMENTS

| | | | |
|---|---|---|---|
| 9,502,565 B2 | 11/2016 | Ching | |
| 9,559,120 B2* | 1/2017 | Cheng | H01L 27/1211 |
| 9,607,901 B2 | 3/2017 | Liu et al. | |
| 9,679,899 B2 | 6/2017 | Loubet et al. | |
| 9,761,699 B2 | 9/2017 | Doris et al. | |
| 2016/0027780 A1* | 1/2016 | Mitard | H01L 21/0245 |
| | | | 257/190 |
| 2016/0064288 A1* | 3/2016 | Cheng | H01L 29/165 |
| | | | 257/192 |
| 2016/0104799 A1* | 4/2016 | Qi | H01L 29/7849 |
| | | | 257/29 |
| 2016/0190304 A1 | 6/2016 | Morin et al. | |
| 2016/0211261 A1* | 7/2016 | Liu | H01L 27/0924 |
| 2016/0254195 A1* | 9/2016 | Jacob | H01L 21/823821 |
| | | | 438/221 |
| 2016/0372552 A1* | 12/2016 | Balakrishnan | H01L 29/785 |
| 2017/0062426 A1* | 3/2017 | Loubet | H01L 27/0924 |
| 2017/0148793 A1* | 5/2017 | Cheng | H01L 29/165 |
| 2018/0005892 A1* | 1/2018 | Cheng | H01L 29/1054 |

\* cited by examiner

VERTICAL FET WITH STRAINED CHANNEL

BACKGROUND

The present invention relates in general to integrated circuit device structures and their fabrication. More specifically, the present invention relates to vertical FETs with a strained channel Integrated circuit devices are a set of electronic circuits on one small chip of semiconductor material. A typical integrated circuit device includes many transistors. As feature sizes have become smaller, different types of transistor architectures have been developed. Among the newer types of transistor architectures is the vertical field effect transistor in which the current direction is vertical (normal to the substrate). It has been found that inducing strain in the channel of a vertical FET is useful to improve carrier mobility and device performance.

SUMMARY

One or more embodiments of the invention provide a method for forming a semiconductor structure. In embodiments of the invention, the method includes depositing a strain relaxed buffer (SRB) layer over a substrate. The method further includes recessing the SRB layer on a first region of the structure and forming a first semiconductor layer on the first region of the structure. The method further includes depositing one or more mandrels over the first semiconductor layer of the first region of the structure. The method further includes depositing a spacer layer over the one or more mandrels, the spacer layer including vertical portions and horizontal portions; the method further includes removing the one or more mandrels and the horizontal portions of the spacer layer. The method further includes performing a reactive ion etch to remove material unprotected by the spacer to form a first channel for a p-type vertical field effect transistor from the first semiconductor layer. The first channel has a compressive strain.

One or more embodiments of the invention provide a semiconductor structure. The semiconductor structure includes a substrate. The semiconductor structure further includes a strain relaxed buffer (SRB) layer over the substrate. The semiconductor structure further includes a first semiconductor layer serving as a channel for a p-type vertical field effect transistor. The first semiconductor layer has a compressive strain. The semiconductor structure further includes a second semiconductor layer. The second semiconductor layer is unstrained.

One or more embodiments of the invention provide a method for forming a semiconductor structure. In embodiments of the invention, the method includes depositing a strain relaxed buffer (SRB) layer over a substrate. The method further includes recessing the SRB layer on a first region of the structure and forming a first semiconductor layer on the first region of the structure. The method further includes depositing one or more mandrels over the first semiconductor layer of the first region of the structure. The method further includes depositing a spacer layer over the one or more mandrels, the spacer layer including vertical portions and horizontal portions; the method further includes removing the one or more mandrels and the horizontal portions of the spacer layer. The method further includes removing material unprotected by the spacer to form a first channel for a p-type vertical field effect transistor from the first semiconductor layer. The first channel has a compressive strain. The method further includes depositing one or more mandrels over the SRB layer of a second region of the structure. The method further includes patterning one or more fins of SRB layer in the second region of the structure. The patterning uses the one or more mandrels as a mask. The method further includes epitaxially growing a second semiconductor layer on exposed sidewalls of the one or more fins. The method further includes removing material unprotected by the spacer to form a second channel for an n-type vertical field effect transistor from the second semiconductor layer. The second channel is unstrained.

BRIEF DESCRIPTION OF THE DRAWINGS

The subject matter of embodiments is particularly pointed out and distinctly defined in the claims at the conclusion of the specification. The foregoing and other features and advantages are apparent from the following detailed description taken in conjunction with the accompanying drawings in which:

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

Described herein is a method of forming vertical field effect transistors (VFET) using strained channel techniques. VFETs are fin-type transistors in which the current travels in the vertical direction, normal to the substrate. This relatively new technology is becoming more popular as feature sizes become smaller because it allows for the formation of smaller transistors.

Turning now to a more detailed description of technologies that are more specifically relevant to aspects of embodiments of the present invention, one or more embodiments form transistors using strain techniques, such as forming the channel with compression. In general, in a p-type FET, compressive strain improves mobility of the holes, allowing for better performance of the VFET. However, it is more difficult to induce strain in the vertical direction, in comparison to planar transistors, due to the free top surface and the fact that a vertically standing semiconductor fin will become relaxed regardless of the initial strain status.

Turning now to an overview of aspects of the invention, embodiments of the invention provide a methodology for fabricating p-type VFETs with compressive strain in the channel, to allow for better performance of the VFET.

Turning now to a more detailed description of embodiments of the present invention, a preliminary fabrication methodology for forming VFETs with strained channels will now be described with reference to FIGS. 1 through 9.

Figure 1:
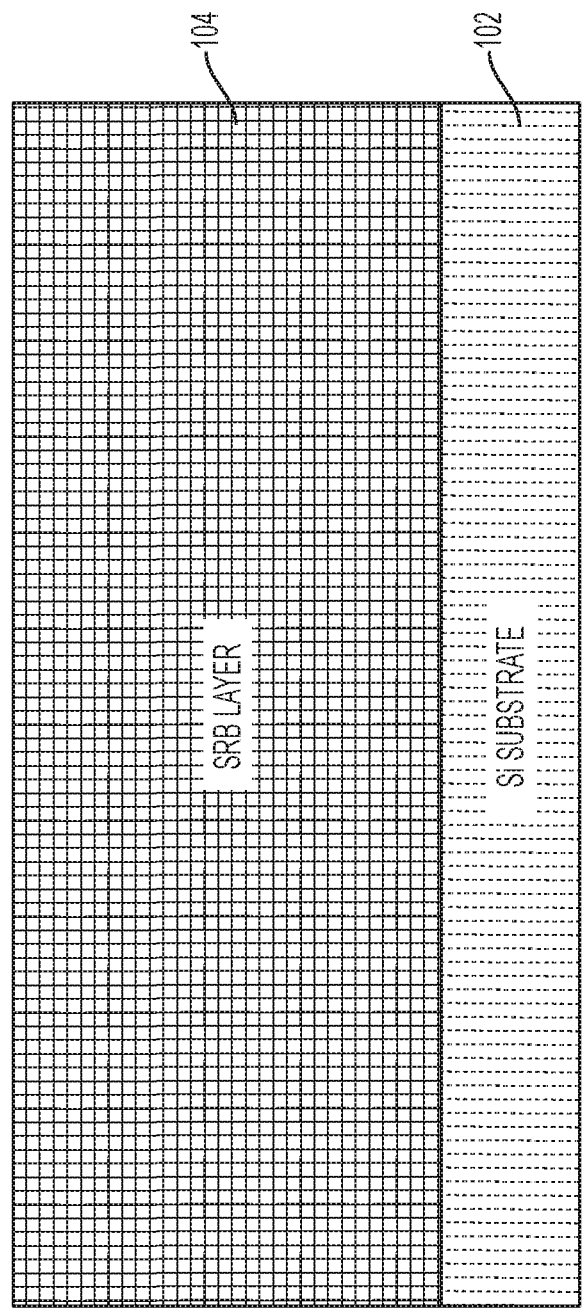
FIG. 1 depicts a cross-sectional view of a semiconductor wafer upon which fabrication operations according to one or more embodiments of the invention can be performed.

FIG. 1 illustrates a portion of a semiconductor wafer shown in a cross-sectional view. A substrate layer 102 is present. Over layer 102 is grown a strain relaxed buffer (SRB) layer 104. Substrate layer 102 can be a semiconductor material, such as silicon or a silicon-containing material, including a bulk substrate. Silicon-containing materials include, but are not limited to, single crystal Si, polycrystalline Si, single crystal silicon germanium (SiGe), polycrystalline SiGe, silicon doped with carbon, amorphous Si, as well as combinations and multi-layers thereof. The term single crystal denotes a crystalline solid, in which the crystal lattice of the entire sample is substantially continuous and substantially unbroken to the edges of the sample with substantially no grain boundaries. Substrate 102 is not limited to silicon-containing materials, as the substrate can include other semiconductor materials, including Ge and compound semiconductors such as GaAs, InAs, and other like semiconductors. The SRB layer is typically constructed of silicon germanium.

In some embodiments, SRB 104 is comprised of silicon germanium (SiGe), and in particular, is of the composition $Si_{(1-x)}Ge_x$, where x is a number ranging from 0 to 1, indicating the atomic percentage of germanium. For example, $Si_{0.75}Ge_{0.25}$ corresponds to a silicon germanium compound with 25 percent germanium. In some embodiments, the percentage of germanium for SRB 104 may range from about 15 percent to about 75 percent, and more preferably between about 20 and about 50 percent. In some embodiments, SRB 104 is doped. In some embodiments, the n-type dopant species may include, but is not limited to, phosphorous, arsenic, and/or antimony. The p-type dopant species may include, but is not limited to, boron, gallium, and/or aluminum. The doping may be in situ during epitaxial growth or subsequently (e.g., ion implant). An optional anneal may be used to provide more homogeneous doping and/or to reduce damage or dislocations. Co-doping of additional species, e.g., C, may be used to suppress subsequent diffusion of electrically active dopant atoms.

Figure 2:
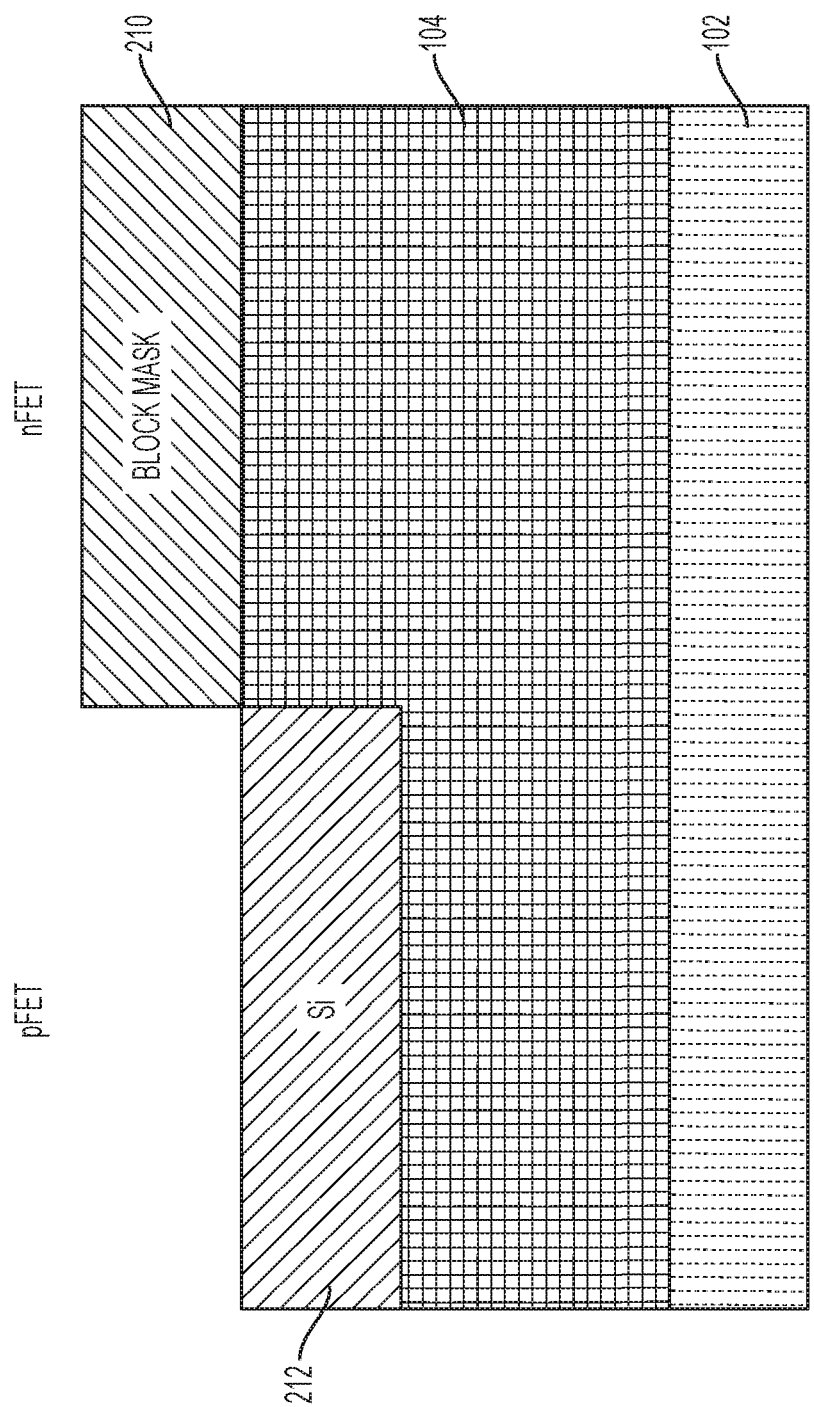
FIG. 2 depicts a cross-sectional view of a semiconductor after a processing operation.

FIG. 2 depicts a cross-sectional view of a semiconductor structure after a processing operation according to one or more embodiments of the invention. The structure presented in FIG. 1 will undergo processing to produce a complementary pair of transistors, a p-type transistor and an n-type transistor. A block mask layer 210 is laid over a portion of the SRB layer 104. The portion that is masked will eventually become an n-type FET, while the unmasked portion will eventually become a p-type FET.

The SRB layer 104 in the unmasked portion is etched. The etch can be a dry etch, such as a reactive ion etch (RIE) or a combination of dry and wet etch, such as a RIE followed by a wet chemical etch, to recess SRB layer 104. In the recessed area, a layer of silicon 212 is epitaxially grown, while the block mask 210 prevents the growth in the area that will become the n-type FET. Silicon 212 will eventually become the channel region for the transistors on the p-type FET side of the structure.

The term "epitaxially grown" refers to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by sources gases are controlled and the system parameters are set so that depositing atoms alight on the deposition surface and remain sufficiently mobile via surface diffusion to orient themselves according to the crystalline orientation of the atoms of the deposition surface.

Figure 3:
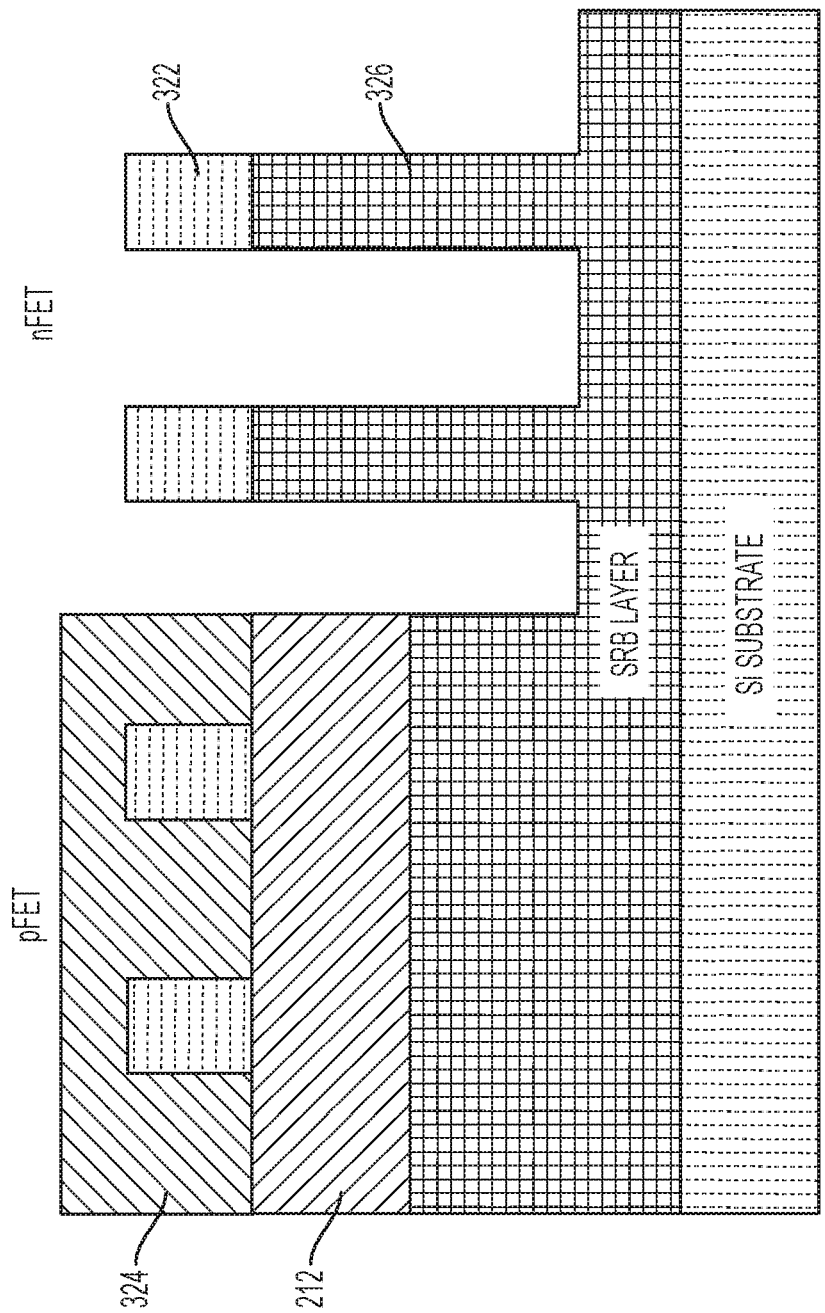
FIG. 3 depicts a cross-sectional view of a semiconductor after a processing operation according to one or more embodiments of the present invention.

FIG. 3 depicts a cross-sectional view of a semiconductor structure after a processing operation according to one or more embodiments of the invention. The block mask is removed from the n-type FET portion of the structure. Mandrels 322 are formed over both the p-type portion of the structure and the n-type portion of the structure. Mandrel 322 can include a variety of different materials, such as a nitride such as silicon nitride, an oxide such as silicon oxide (SiO) or SiCO, amorphous silicon, amorphous carbon, or any other material with a selective etch property. Thereafter, a block mask 324 is formed over the p-type portion of the structure.

A recess performed. This can be performed using an etching technique, such as a RIE. Block mask 324 prevents the etch from having an effect on the p-type portion. Over the n-type portion, mandrel 322 protects the areas of SRB layer 102 that are directly beneath the mandrel. However, the remaining portions of SRB layer 102 are removed, forming fin-type structures 326.

Figure 4:
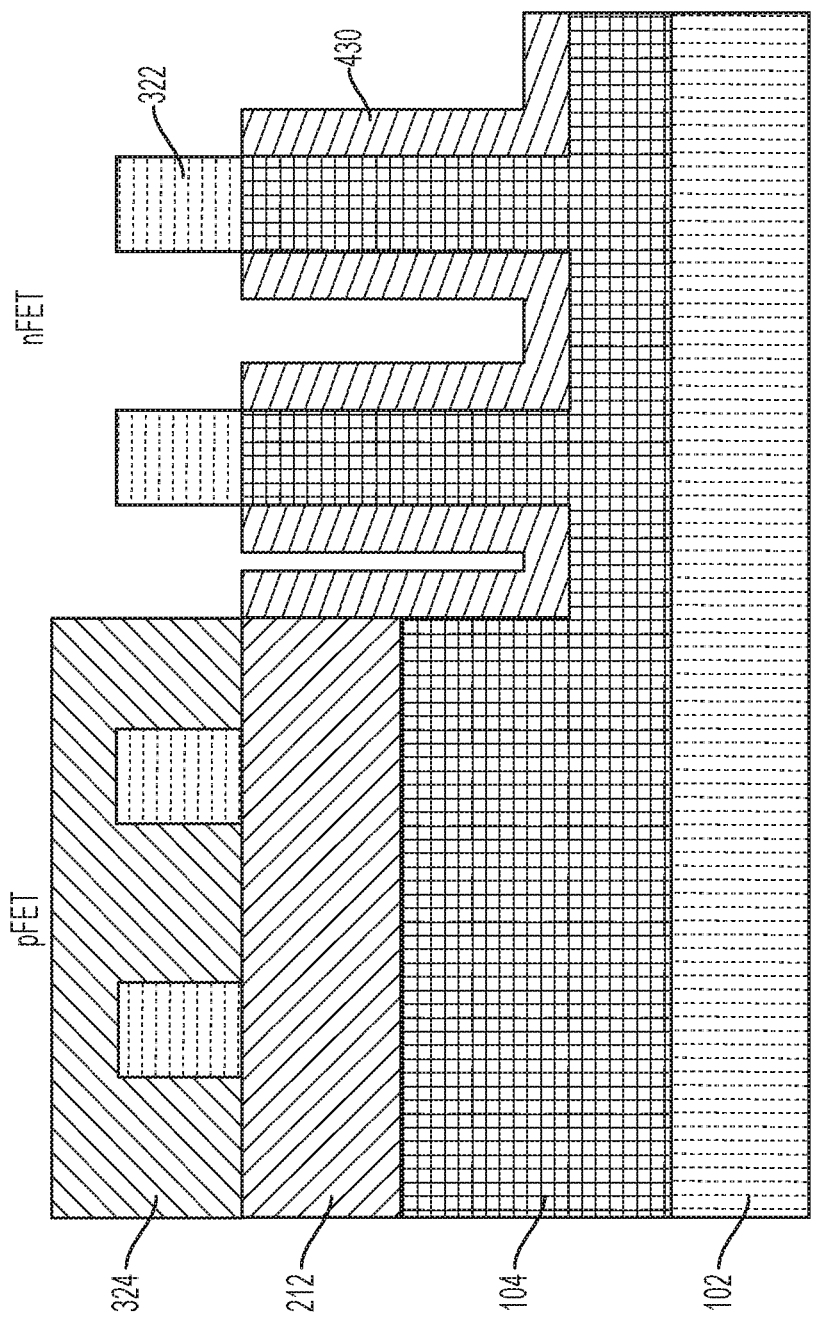
FIG. 4 depicts a cross-sectional view of a semiconductor after a processing operation according to one or more embodiments of the present invention.

FIG. 4 depicts a cross-sectional view of a semiconductor structure after a processing operation according to one or more embodiments of the invention. A layer 430 of silicon is epitaxially grown on the n-type portion (the p-type portion is still covered by block mask 324). A fully relaxed SRB layer 104 has a larger lattice constant than the unstrained silicon. Therefore, when silicon layer 430 is epitaxially grown on the SRB layer 104, the silicon lattice follows the lattice constant of SRB layer 104, thus silicon layer 430 has a tensile strain in the vertical direction. Silicon layer 430 will eventually become the channel region for transistors on the n-type FET side of the semiconductor structure.

Figure 5:
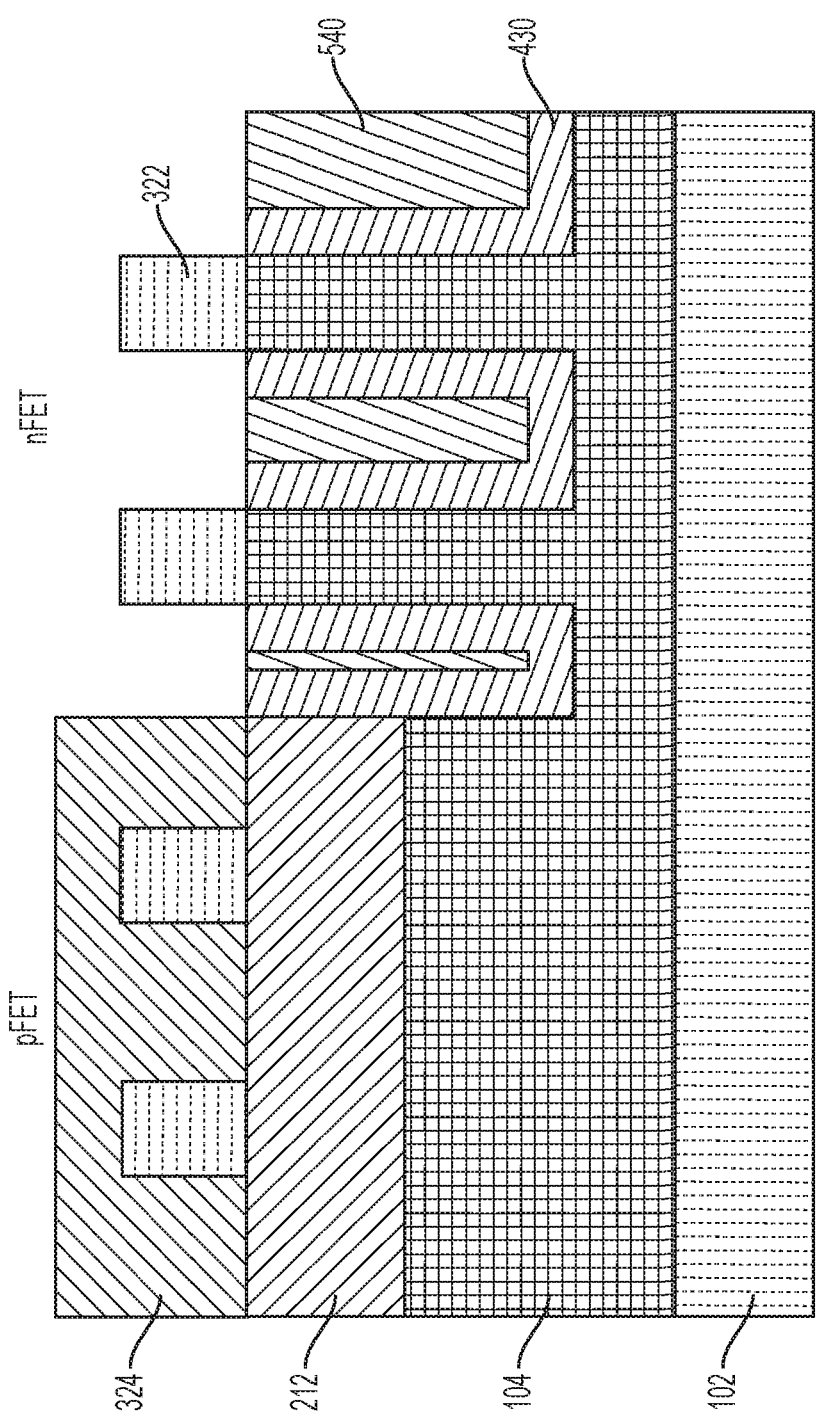
FIG. 5 depicts a cross-sectional view of the semiconductor structure after a processing operation according to one or more embodiments of the present invention.

FIG. 5 depicts a cross-sectional view of a semiconductor structure after a processing operation according to one or more embodiments of the invention. A layer 540 of amorphous silicon is filled the trenches in between the layer 430 in the n-type region. An etch is performed to level the top of layer 540 with the bottom of mandrel 322.

Figure 6:
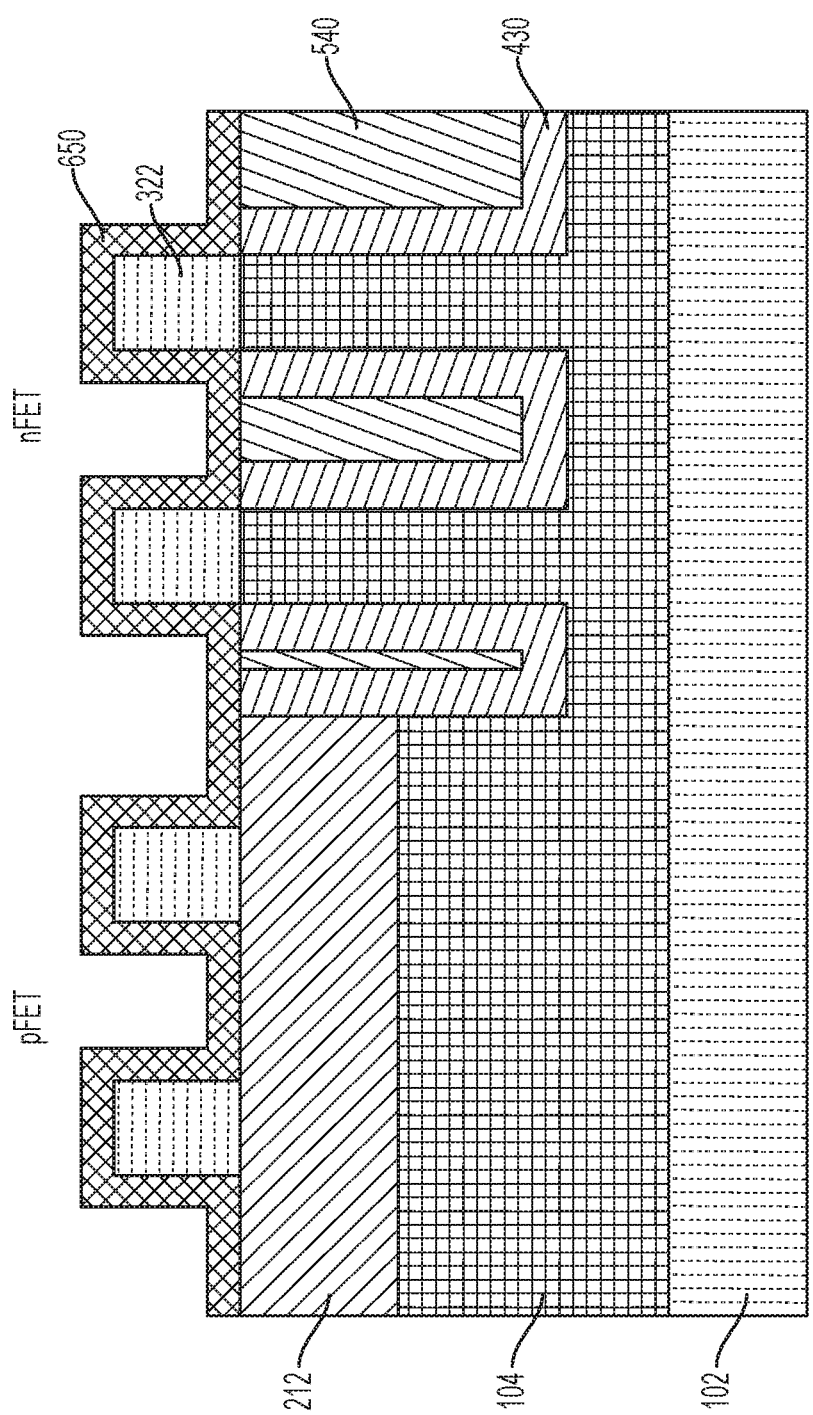
FIG. 6 depicts a cross-sectional view of the semiconductor structure after a processing operation according to one or more embodiments of the present invention.

FIG. 6 depicts a cross-sectional view of a semiconductor structure after a processing operation according to one or more embodiments of the invention. The block mask (element 324 of FIG. 3) that was covering the p-type portion is removed. A spacer layer 650 is deposited over both the p-type and n-type sides of the structure, covering mandrel 322. Spacer layer 650 can include one of a variety of different materials. Exemplary materials include a nitride (such as silicon nitride), an oxide (such as silicon oxide), SiCN, SiBCO, or any other dielectric material. Spacer layer 650 includes both horizontal portions and vertical portions (located on the sidewall of the mandrel 322).

Figure 7:
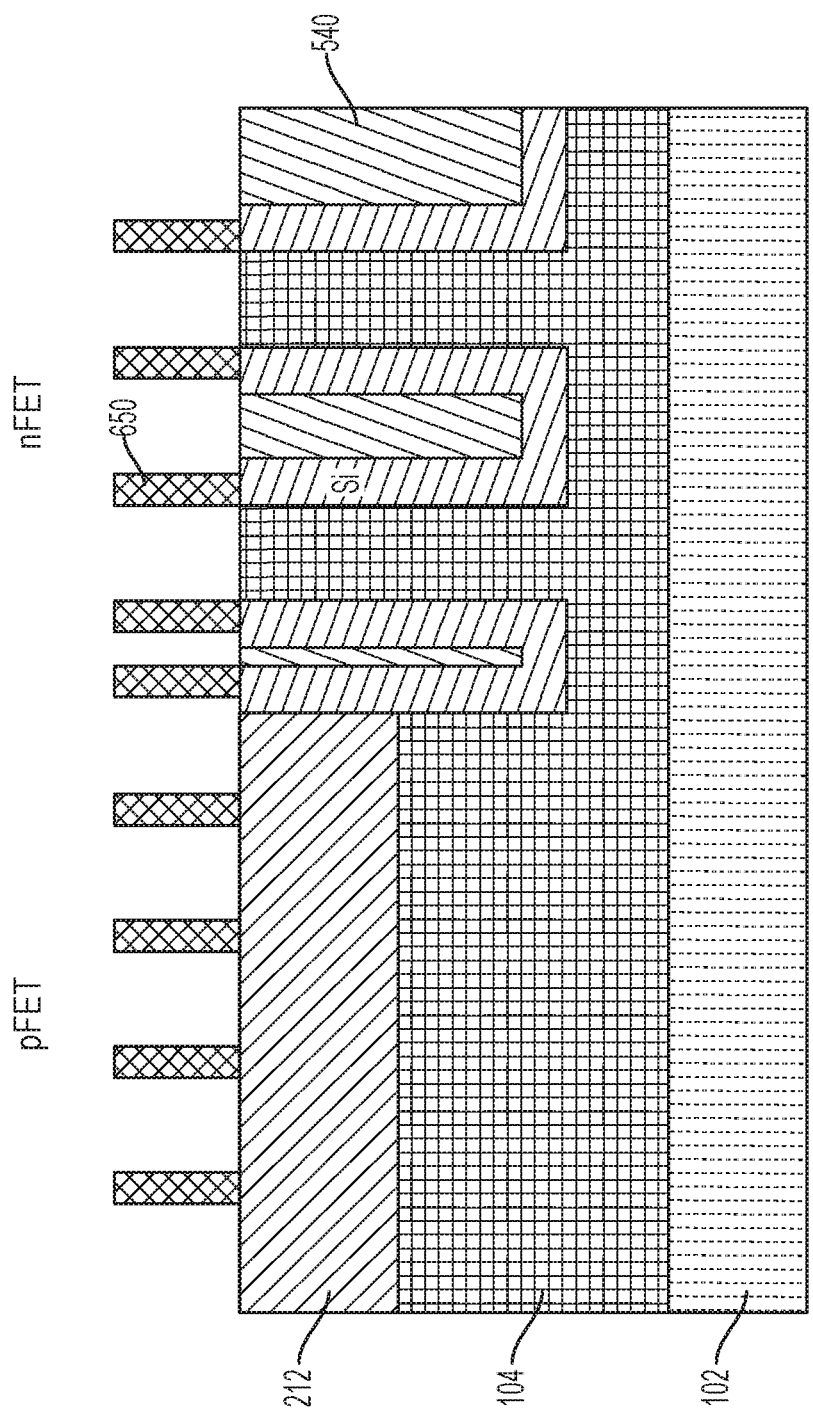
FIG. 7 depicts a cross-sectional view of the semiconductor structure after a processing operation according to one or more embodiments of the present invention.

FIG. 7 depicts a cross-sectional view of a semiconductor structure after a processing operation according to one or more embodiments of the invention. A sidewall image transfer (SIT) process is performed that involves performing a RIE on the spacer layer to remove the horizontal layers. Thereafter, the mandrel (element 322 of FIG. 3) is removed using a selective process. What remains are the vertical portions of spacer 650.

Figure 8:
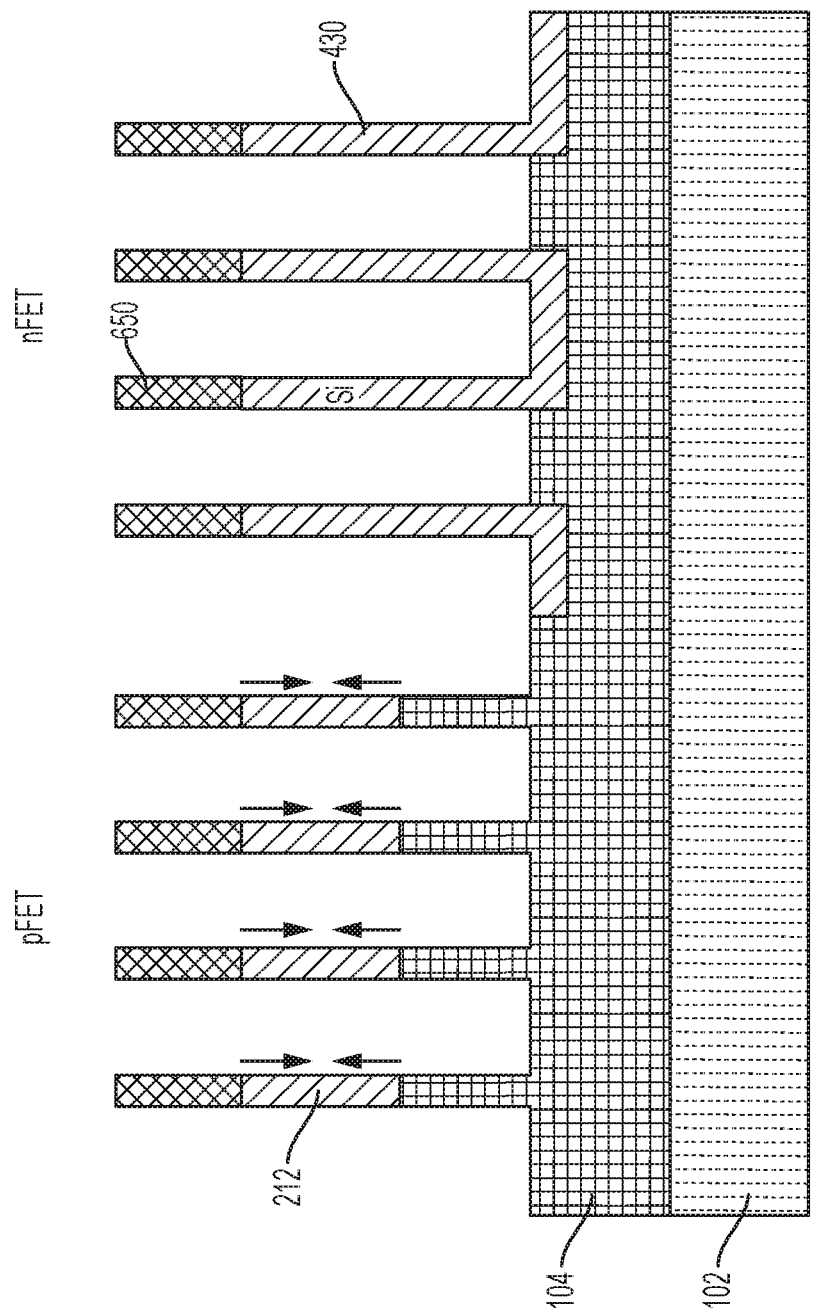
FIG. 8 depicts a cross-sectional view of the semiconductor structure after a processing operation according to one or more embodiments of the present invention.

FIG. 8 depicts a cross-sectional view of a semiconductor structure after a processing operation according to one or more embodiments of the invention. A RIE is performed, affecting all layers not protected by spacer 650. On the p-type portion, the only areas below the spacer 650 are the areas of silicon 212. On the n-type portion, the layers of silicon 430 are unstrained along the vertical direction because the strain is relaxed once the initial anchor provided by SRB layer 104 is etched away. However, those areas of silicon 212 are compressively stressed in the vertical direction, in which the current direction is vertical, resulting the improvement of hole mobility and device performance. As long as silicon 430 thickness on SRB 104 is below the critical thickness, the misfit dislocations at the silicon/SRB interface are not formed and the compressive strain in the vertical channel direction is preserved. In embodiments, Si thickness can be a range of 20 nm to 60 nm, in which SRB is comprised of silicon germanium and germanium concentration is below 25%. Si thickness can be below about 40 nm, in which germanium concentration of SRB is higher than 25%.

Figure 9:
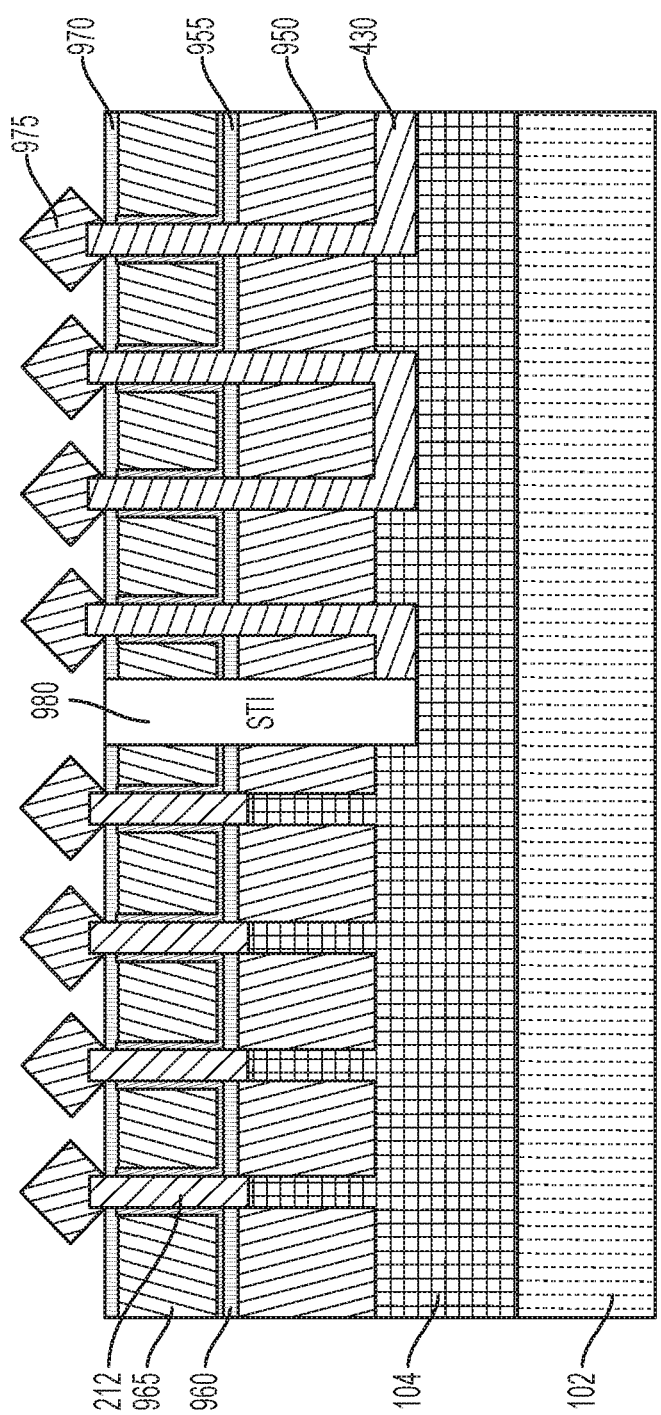
FIG. 9 depicts a cross-sectional view of the semiconductor structure after a processing operation after traditional semiconductor processing steps.

FIG. 9 depicts a cross-sectional view of a semiconductor structure after a processing operation according to one or more embodiments of the invention. FIG. 9 illustrates a finished semiconductor structure. The steps between FIG. 8 and FIG. 9 are known in the art, performed using traditional semiconductor processing techniques. Atop silicon substrate 102 is the SRB layer 104 and silicon layer 430. Above layer 430 is the bottom source/drain layer 950, followed by spacer layer 955. High-k dielectric layer 960 is between the spacer layer 955 and metal gate 965. A top spacer 970 is between metal gate 965 and top source/drain layer 975. A shallow trench isolation (STI) layer 980 is between the p-type transistor on the left side of the diagram and the n-type transistor on the right side of the diagram. It should be understood that FIG. 9 presents a simplified version of a semiconductor structure. Actual semiconductor structures of an embodiment can feature additional layers and structures.

Various embodiments of the present invention are described herein with reference to the related drawings. Alternative embodiments can be devised without departing from the scope of embodiments of the present invention. It is noted that various connections and positional relationships (e.g., over, below, adjacent, etc.) are set forth between elements in the following description and in the drawings. These connections and/or positional relationships, unless specified otherwise, can be direct or indirect, and embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor structure, the method comprising:
   depositing a strain relaxed buffer (SRB) layer over a substrate;
   recessing the SRB layer on a first region of the structure;
   forming a first semiconductor layer on the first region of the structure;
   depositing one or more mandrels over the first semiconductor layer of the first region of the structure;
   depositing a spacer layer over the one or more mandrels, the spacer layer comprising vertical portions and horizontal portions;
   removing the one or more mandrels and the horizontal portions of the spacer layer; and
   removing material unprotected by the spacer to form a first channel for a p-type vertical field effect transistor from the first semiconductor layer, wherein the first channel includes a compressive strain.

2. The method of claim 1, wherein:
   the semiconductor structure is a complementary semiconductor; and
   the method further comprises:
   depositing one or more mandrels over the SRB layer of a second region of the structure;
   patterning one or more fins of SRB layer in the second region of the structure, using the one or more mandrels as a mask; and
   epitaxially growing a second semiconductor layer on the exposed sidewalls of the one or more fins;
   wherein performing a reactive ion etch to remove material unprotected by the spacer form a second channel for an n-type vertical field effect transistor from the second semiconductor layer;
   wherein the second channel is unstrained.

3. The method of claim 2 further comprising placing a block mask on the second region to prevent formation of the first semiconductor layer on the second region.

4. The method of claim 3 further comprising filling a region between gaps between the second semiconductor layer on the exposed sidewalls of the one or more fins with amorphous silicon.

5. The method of claim 2, wherein the second semiconductor layer comprises silicon.

6. The method of claim 1, wherein the first semiconductor layer comprises silicon.

7. The method of claim 1, wherein:
the substrate comprises silicon; and
the SRB layer comprises silicon germanium.

8. The method of claim 1, wherein the mandrel comprises a nitride.

9. The method of claim 1, wherein the mandrel comprises an oxide.

10. The method of claim 1, wherein the spacer layer comprises a dielectric material.

11. A semiconductor structure, comprising:
a substrate:
a strain relaxed buffer (SRB) layer over the substrate;
a first channel for a p-type vertical field effect transistor; wherein the first channel includes a compressive strain; and
a second channel for an n-type vertical field effect transistor; wherein the second channel is unstrained;
wherein the first channel is formed by a method comprising:
depositing a first semiconductor layer over the SRB layer in a first region of the structure;
depositing a first mandrel over the first semiconductor layer;
depositing a spacer layer over the first mandrel, the spacer layer comprising vertical portions and horizontal portions;
removing the first mandrel and the horizontal portions of the spacer layer; and
performing a reactive ion etch to remove material unprotected by remaining portions of the spacer layer to form the first channel from the first semiconductor layer;
wherein the second channel is formed by a method comprising:
depositing a second mandrel over the SRB layer in a second region of the structure;
patterning one or more fins from the SRB layer in the second region of the structure, using the second mandrel as a mask;
epitaxially growing a second semiconductor layer on sidewalls of the one or more fins;
depositing the spacer layer over the second mandrel; and
performing a reactive ion etch to remove material unprotected by the spacer layer to form the second channel from the second semiconductor layer.

12. The semiconductor structure of claim 11, wherein the method further comprises
placing a block mask on the second region to prevent formation of the first semiconductor layer on the second region.

13. The semiconductor structure of claim 12, further comprising filling a region between gaps between the second semiconductor layer on the exposed sidewalls of the one or more fins with amorphous silicon.

14. The semiconductor structure of claim 11, wherein the second semiconductor layer comprises silicon.

15. The semiconductor structure of claim 11, wherein the first semiconductor layer comprises silicon.

16. The semiconductor structure of claim 11, wherein:
the substrate comprises silicon; and
the SRB layer comprises silicon germanium.

17. A method for forming a complementary semiconductor structure, the method comprising:
depositing a strain relaxed buffer (SRB) layer over a substrate;
recessing the SRB layer on a first region of the structure;
forming a first semiconductor layer on the first region of the structure;
depositing one or more mandrels over the first semiconductor layer of the first region of the structure;
depositing a spacer layer over the one or more mandrels, the spacer layer comprising vertical portions and horizontal portions;
removing the one or more mandrels and the horizontal portions of the spacer layer;
removing material unprotected by the spacer to form a first channel for a p-type vertical field effect transistor from the first semiconductor layer;
depositing one or more mandrels over the SRB layer of a second region of the structure;
patterning one or more fins of SRB layer in the second region of the structure, using the one or more mandrels as a mask;
epitaxially growing a second semiconductor layer on the exposed sidewalls of the one or more fins; and
removing material unprotected by the spacer to form a second channel for an n-type vertical field effect transistor from the second semiconductor layer; wherein
the first channel has a compressive strain; and
the second channel is unstrained.

18. The method of claim 17, further comprising:
placing a block mask on the second region to prevent formation of the first semiconductor layer on the second region; and
filling a region between gaps between the second semiconductor layer on the exposed sidewalls of the one or more fins with amorphous silicon.

19. The method of claim 17, wherein:
the first semiconductor layer comprises silicon;
the second semiconductor layer comprises silicon.

* * * * *